(12) United States Patent
Mallikarjunaswamy

(10) Patent No.: US 6,825,531 B1
(45) Date of Patent: Nov. 30, 2004

(54) LATERAL DMOS TRANSISTOR WITH A SELF-ALIGNED DRAIN REGION

(75) Inventor: Shekar Mallikarjunaswamy, San Jose, CA (US)

(73) Assignee: Micrel, Incorporated, San Jose, CA (US)

(*) Notice: Subject to any disclaimer, the term of this patent is extended or adjusted under 35 U.S.C. 154(b) by 0 days.

(21) Appl. No.: 10/618,376

(22) Filed: Jul. 11, 2003

(51) Int. Cl.[7] .......................... H01L 29/76; H01L 23/58
(52) U.S. Cl. ...................... 257/343; 257/492; 257/493
(58) Field of Search ............................... 257/335, 343, 257/492, 493

(56) References Cited

PUBLICATIONS

Shuming Xu et al., "High Power Silicon RF LDMOSFET Technology for 2.1GHz Power Amplifier Applications", ISPSD 2003, Apr. 14–17, Cambridge, UK, pp. 190–193.

Primary Examiner—Steven Loke
(74) Attorney, Agent, or Firm—Patent Law Group LLP; Carmen C. Cook

(57) ABSTRACT

An LDMOS transistor includes a body region, a source region, a conductive gate, an alignment structure and a drain region. The conductive gate is insulated from the semiconductor layer by a dielectric layer and overlies the body region. The source region is formed in the body region and is formed self-aligned to a first edge of the conductive gate. The alignment structure is formed adjacent a second edge, opposite the first edge, of the conductive gate. The alignment structure has a first edge in proximity to the second edge of the conductive gate. The drain region is formed in the semiconductor layer self-aligned to the second edge, opposite the first edge, of the alignment structure. The alignment structure can be formed in a polysilicon layer or a dielectric layer. The incorporation of the alignment structure in the LDMOS transistor enables self-aligned drain region or drain contact opening to be formed.

36 Claims, 6 Drawing Sheets

LATERAL DMOS TRANSISTOR WITH A SELF-ALIGNED DRAIN REGION

FIELD OF THE INVENTION

The invention relates to LDMOS transistor structures and, in particular, to a method for forming an LDMOS transistor with reduced conduction and switching losses.

DESCRIPTION OF THE RELATED ART

FIG. 1 is a cross-sectional view of a conventional N-type lateral double-diffused MOS (LDMOS) transistor. In general, LDMOS transistor 10 includes a polysilicon gate 12, an N+ source region 14 formed in a P-type body region 16, and an N+ drain region 18. Polysilicon gate 12 is insulated from the semiconductor substrate by a thin gate oxide layer. Drain region 18 can be formed in an N-well 17 or in a more heavily doped N-type region, such as an N-Drift region 15. A P+ diffusion region 13 is usually included for making electrical contact to body region 16.

In LDMOS transistor 10, source region 14 and body region 16 are self-aligned to the left edge of polysilicon gate 12. That is, during the fabrication process to form LDMOS transistor 10, polysilicon gate 12 is defined and then the source region implantation and the body region implantation are preformed using the polysilicon gate as a mask. As thus implanted, the source region dopants and the body region dopants are aligned to the left edge of polysilicon gate 12. After subsequent heat treatments to diffuse the dopants and anneal the silicon substrate, N+ source region 14 and body region 16 as shown in FIG. 1 are formed.

However, at the drain side of LDMOS transistor 10, the diffusion regions, such as the drain region, and the drain contact structures, such as the drain contact, are not self-aligned to the right edge of the polysilicon gate. When N-Drift region 15 is included, the N-drift region can be formed self-aligned to the right edge of the polysilicon gate. However, drain region 18 is formed spaced apart from the right edge of polysilicon gate 12 to form a drift region between body region 16 and heavily doped N+ drain region 18. Furthermore, a drain contact 11 for making electrical contact to drain region 18 is formed above the drain diffusion region. The contact opening is also made without self-alignment to the polysilicon gate.

Because the N+ drain region and the drain contact opening are not self-aligned, drain region 18 has to be spaced sufficiently apart from the right edge of polysilicon gate 12 to meet lithography requirements for misalignment tolerance. Furthermore, the distance between polysilicon gate 12 and drain region 18 is also selected to meet the desired gate to drain breakdown voltage requirements, the longer the distance, the larger the breakdown voltage. Due to the misalignment tolerance and breakdown voltage requirements, a lower limit is placed on the distance B between polysilicon gate 12 and drain region 18 and distance B cannot be readily minimized. As a result, the conventional LDMOS transistor has a higher cell pitch. Higher cell pitch is undesirable because it results in a higher device resistance ($R_{DS}$) as the distance between the drain and the source of the transistor is larger. Higher cell pitch is also undesirable because the resultant transistor device consumes more silicon area and thus is more costly to fabricate.

In some conventional LDMOS transistors, the polysilicon gate is extended so that the drain region can be formed self-aligned to the edge of the polysilicon gate. However, such LDMOS structures are undesirable because the poly to drain breakdown voltage becomes very low because of the thin gate oxide layer that separates the polysilicon gate from the drain diffusion region.

In the LDMOS transistor of FIG. 1, an N-Drift diffusion region 15 is included at the drain side of the device. Typically, the N-Drift region is more heavily doped than N-well 17 and functions to lower the device resistance ($R_{DS}$) of the LDMOS transistor. However, N-Drift region 15 is included typically at the expense of a lower breakdown voltage between the p-type body region and the N-type drain drift region. Specifically, the breakdown voltage between the body and the drain drift region is determined by the doping of the more heavily doped side. Since N-Drift diffusion region is more heavily doped than N-well, when N-Drift diffusion region is included in the LDMOS transistor, the breakdown voltage between the body and the drift region is lowered. For example, the breakdown voltage between the body region and the N-well can be on the order of 80 volts above while the breakdown voltage between the body region and the N-Drift can be only about 20 volts.

It is generally desirable to reduce the device resistance $R_{DS}$ and also the cell pitch of an LDMOS transistor. The device resistance $R_{DS}$ includes the resistance of the source metal line connected to the source region, the source contact resistance, the source region resistance, the channel resistance, the drain region resistance, the resistance of the drain metal line connected to the drain region, and the drain contact resistance. To reduce the device resistance of an LDMOS transistor, it is often necessary to reduce the dimensions of the structures in the LDMOS transistor.

Typically, the resistance of the drain region contributes to about 30–40% of the total device resistance and the channel resistance contributes to about another 30%. Therefore, to reduce the device resistance, it is sometimes desirable to reduce the polysilicon length of the LDMOS transistor. However, there is a limit as to how much the polysilicon gate length can be scaled down due to limitations from photolithography technology. This is because in the self-aligned process to form the source region and the body region, the photoresist mask for the source and the body implantation is formed centered or with minimum overlap rule for misalignment on the polysilicon gate. If the length of the polysilicon gate is reduced too much, there may not be enough room for the mask to align properly on the top of polysilicon. Thus, the polysilicon gate has to have a minimum length to meet the lithography requirement for the placement of the mask on the polysilicon gate to allow sufficient room for misalignment.

It is desirable to provide an LDMOS transistor with reduced device resistance, reduced device pitch, including reduction of the channel length of the LDMOS transistor.

SUMMARY OF THE INVENTION

According to one embodiment of the present invention, an LDMOS transistor includes a body region, a source region, a conductive gate, an alignment structure and a drain region. The body region is of a first conductivity type and formed in a semiconductor layer of a second conductivity type. The source region is of the second conductivity type and formed in the body region. The conductive gate is insulated from the semiconductor layer by a first dielectric layer and overlies the body region. The source region is formed self-aligned to a first edge of the conductive gate. The alignment structure is formed adjacent a second edge, opposite the first edge, of the conductive gate. The alignment structure has a first edge in proximity to the second edge of the conductive gate. The drain region is of the second conductivity type and formed in the semiconductor layer self-aligned to the second edge, opposite the first edge, of the alignment structure.

In one embodiment, the conductive gate is formed by a first polysilicon layer and the alignment structure is formed by a second polysilicon layer. In another embodiment, the alignment structure is a silicon nitride layer.

The incorporation of the alignment structure in the LDMOS transistor of the present invention enables self-aligned drain region and/or drain contact opening to be formed.

The present invention is better understood upon consideration of the detailed description below and the accompanying drawings.

DETAILED DESCRIPTION OF THE PREFERRED EMBODIMENTS

In accordance with the principles of the present invention, an LDMOS transistor includes an alignment structure to allow both the source region and the drain region to be formed in a self-aligned manner. Furthermore, the drain contact opening can also be formed self-aligned to the alignment structure. The LDMOS transistor thus formed can have a smaller cell pitch and therefore a lower device resistance, without degrading other device characteristics such as breakdown voltages. In one embodiment, the alignment structure is a dielectric layer such as a silicon nitride layer. In another embodiment, the LDMOS transistor is fabricated in a double-poly process and the alignment structure is formed using one of the two polysilicon layers. The LDMOS transistor of the present invention can realize reduced specific resistance (the product of device resistance and area of the transistor) by reducing the drain resistance. Moreover, the alignment structure can be used to reduce the gate-to-drain overlap capacitance, there by improving the switching speed of operation.

When a polysilicon layer is used to form the alignment structure of the LDMOS transistor of the present invention, the transistor can be fabricated using conventional or commercially available double-poly CMOS or BiCMOS fabrication processes. The alignment structure can be formed using either the poly1 or poly2 layers that are available in a double-poly process. Furthermore, the alignment structure can be formed using either a high sheet resistance polysilicon layer or a low sheet resistance polysilicon layer, as will be described in more detail below. Therefore, another advantage offered by the LDMOS transistor of the present invention is ease of integration into existing fabrication processes.

Figure 1:
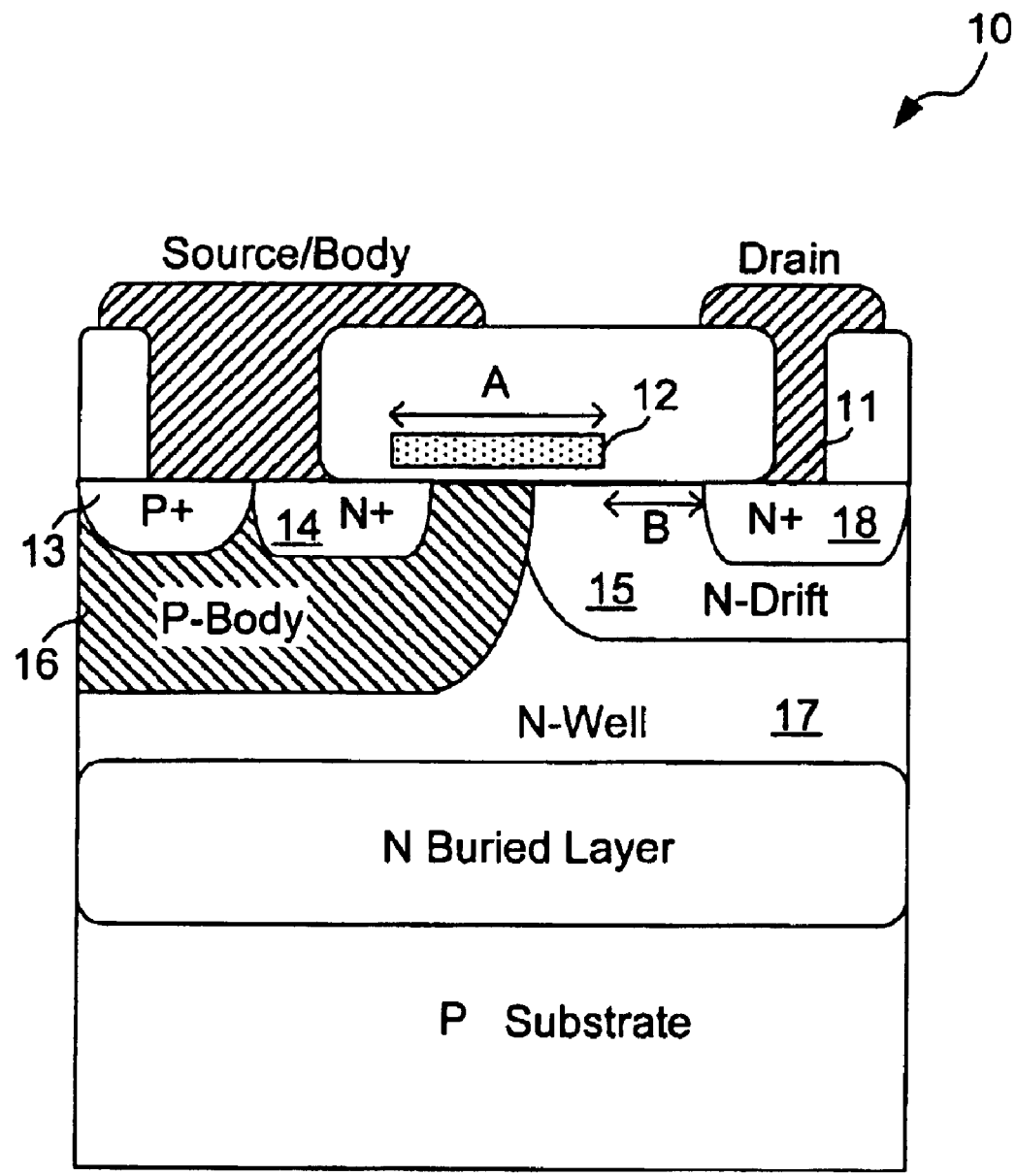
FIG. 1 is a cross-sectional view of a conventional N-type lateral double-diffused MOS (LDMOS) transistor.
Figure 2:
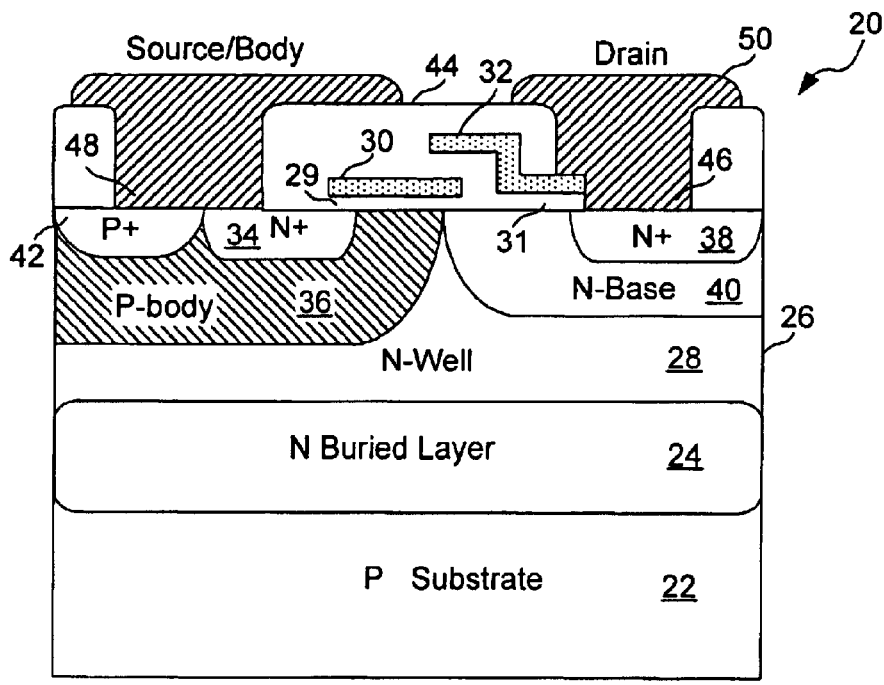
FIG. 2 is a cross-sectional view of an LDMOS transistor according to one embodiment of the present invention.

FIG. 2 is a cross-sectional view of an LDMOS transistor according to one embodiment of the present invention. Referring to FIG. 2, N-type LDMOS transistor 20 is built using a double-poly fabrication process where the second polysilicon layer, also referred to as the poly2 layer, is used to form the alignment structure. In the present embodiment, N-type LDMOS transistor 20 is built on a semiconductor layer including an N-type epitaxial layer 26 formed on a p-type silicon substrate 22. In the following description, the semiconductor structure in and on which the LDMOS transistor of the present invention is formed will be collectively referred to as "the semiconductor layer." In the embodiment shown in FIG. 2, the semiconductor layer includes N-type epitaxial layer 26 and p-type substrate 22. A buried layer 24 is formed on substrate 22 for isolation. One of ordinary skill in the art would appreciate that the LDMOS transistor of the present invention can be built on various types of semiconductor layers, such as being built on a P-type epitaxial layer, or built on an N-type substrate directly without the use of an epitaxial layer. Furthermore, the inclusion of buried layer 24 is optional. The exact structural configuration of the semiconductor layer is not critical to the use and practice of the present invention.

The semiconductor layer of LDMOS transistor 20 can be formed using conventional processing steps. In the present embodiment, a p-type silicon substrate having a resistivity of 5 to 10 ohm-cm forms substrate 22. Then, an N-type buried layer 24 is formed in p-type substrate 22, such as by masking, ion implantation and subsequent anneal. N-type buried layer 24 is optional and is generally included to improve device isolation and latchup immunity. Following the buried layer formation, an epitaxial process is carried out to form an epitaxial layer 26 on substrate 22 in a conventional manner, such as by standard epitaxial growth techniques. In the present embodiment, epitaxial layer 26 is an N-type epitaxial layer having a resistivity of approximately 3 ohm-cm.

In the present embodiment, LDMOS transistor 20 is formed in an N-Well 28 using conventional processing steps, such as by masking selective regions of epitaxial layer 26, performing ion implantation using the appropriate dopants, and annealing to drive-in the dopants. N-well region 28 is optional and in other embodiments, LDMOS transistor 20 can be formed directly in N-type epitaxial layer 26. However, the use of N-well 28 in transistor 20 has the advantage of lowering the drain resistance of the LDMOS transistor.

Subsequent to the formation of N-well 28, a first gate oxide layer 29 is formed, such as by conventional thermal oxidation processes, and a first polysilicon (poly1) layer is deposited, such as by using chemical vapor deposition. The first polysilicon layer is patterned and etched to define a polysilicon gate (poly gate) 30 of LDMOS transistor 20. The poly1 layer is typically heavily doped and thus, is a low sheet resistance layer.

In a double poly process, a second gate oxide layer 31 is formed on the semiconductor layer and on top of the poly1 layer, such as by thermal oxidation. A second polysilicon (poly2) layer is then deposited, such as by using chemical vapor deposition. The second polysilicon layer is patterned and etched to define a polysilicon alignment structure 32 of LDMOS transistor 20. In the present embodiment, the left edge of alignment structure 32 overlaps the right edge of polysilicon gate 30. Also, the poly2 layer used to form alignment structure 32 is a heavily doped N-type polysilicon layer. In other embodiments, alignment structure 32 can be made from a heavily doped P-type polysilicon layer or a lightly doped, high sheet resistance polysilicon layer.

Depending on the fabrication process, the thickness of first gate oxide layer 29 and the thickness of second gate oxide layer 31 may be the same or may be different. Furthermore, in a dual gate oxide process or in a poly1-to-poly2 capacitor process, the thickness of the oxide between the poly1 and poly2 layer is inherently thicker than the oxide between the poly2 layer and the semiconductor layer due to higher oxidation rate on heavily doped poly1 layer.

After the poly1 and poly2 layers are deposited and patterned to form gate 30 and alignment structure 32, the source, body and drain diffusion regions of the LDMOS transistor can now be formed. Specifically, an N+ source region 34 and a P-type body (P-body) region 36 are formed by ion-implantation and subsequent anneal/drive-in. Source region 34 and body region 36 are self-aligned to left edge (the source end) of poly gate 30. That is, poly gate 30 is used as a mask for the ion-implantation steps for forming source region 34 and body region 36. An N+ drain region 38 and an N-type drift region 40 are also formed by ion-implantation and subsequent anneal/drive-in. In the present embodiment, N-type drift region 40 is formed using an N-type base diffusion region (N-Base). However, in other embodiments, N-type drift region 40 can be formed as other N-type diffusion region having the desired dopant concentration. In accordance with the present invention, because LDMOS transistor 20 includes alignment structure 32, drain region 38 and N-Base 40 are formed self-aligned to the right edge (the drain end) of alignment structure 32. That is, alignment structure 32 serves as a mask for the ion-implantation steps for forming drain region 38 and N-Base 40.

In the present embodiment, LDMOS transistor 20 includes N-Base 40 which is more heavily doped than N-Well 28. N-Base 40 is optional and is included to reduce the drain resistance of the transistor. In other embodiments, N-Base 40 may be omitted and N-Well 28 connects the drain region of LDMOS transistor 20 to the body region. As mentioned above, in yet other embodiments, N-well 28 may be omitted also and the N-type epitaxial layer 26 forms the drift region of LDMOS transistor 20 connecting N+ drain region 38 to P-body region 36.

The ion implantation steps for forming N+ source region 34 and N+ drain region 38 may use the same ion implantation step or separate ion implantations can be performed for the source and drain regions. After the ion implantation steps for forming the N+ source, the p-body and drain regions, an ion implantation step may be carried out to form a P+ body contact region 42 in P-body 36. After all of the ion implantation steps, an anneal or drive-in process can be performed to diffuse the implanted dopants and anneal the semiconductor layer.

After formation of N+ source region 34, P-body region 36, N+ drain region 38, N-Base 40 and P+ contact region 42, a dielectric layer 44 is deposited to encapsulate the semiconductor layer and the polysilicon layers. Contact openings 46 and 48 are subsequently formed to provide electrical contact to the diffusion regions. Contact openings 46 and 48 can be formed using conventional processing steps, such as by photomasking and dry etching. In the present embodiment, a butting contact 48 is formed for making connection to both N+ source region 34 and P+ contact region 42. In accordance with the present invention, contact opening 46 for making electrical connection to drain region 38 is formed self-aligned to alignment structure 32. That is, the right edge (drain end) of alignment structure 32 defines the left edge of contact opening 46.

Furthermore, in the present embodiment, drain contact opening 46 straddles the right edge (drain end) of alignment structure 32. When a metallization layer is subsequently formed, such as by deposition and patterning, the drain metal contact 50 electrically connects the polysilicon alignment structure to the drain diffusion region. Because alignment structure 32 is formed in the poly2 layer and overlaps the poly gate in the poly 1 layer, a large misalignment in the drain contact opening can be tolerated without resulting in the drain contact shorted to poly gate 30. In effect, the poly2 alignment structure 32 shields the poly gate from the drain contact opening.

When LDMOS transistor 20 is thus formed, the source region and the body region are self-aligned as well as the drain region and the N-base region. Therefore, the only remaining misalignment in LDMOS transistor 20 is the poly1 to poly2 misalignment. A poly1 to poly2 misalignment may result in N-Base 40 being formed apart from body region 36 without abutting the body region. However, such misalignment does not detrimentally impact the performance of the LDMOS transistor as long as N-Well 28 is present to provide an N-type region connecting drain region 38 to P-body 36. In some embodiments, it may be desirable to have the more heavily doped N-base region 40 formed spaced apart from P-body 36 anyway to minimize impact ionization at the junction of N-base and P-body. In this manner, the breakdown voltage between the P-body region and the drain drift region is increased because N-well 28 is lightly doped as compared to N-Base 40. Thus, any poly1 to poly2 misalignment will not have any appreciable impact to the electrical characteristics of the LDMOS transistor. In the embodiment shown in FIG. 2, N-base 40 is formed abutting P-body 36. However, this is illustrative only and in other embodiments, N-base 40 may be formed spaced apart from P-body 36.

In the present embodiment, alignment structure 32 is a heavily doped, low sheet resistance polysilicon layer and is formed overlapping poly gate 30. Thus, an electric field is formed between poly gate 30 and alignment structure 32 which may result in undesirable capacitive coupling. However, as discussed above, because the poly1 layer used to form poly gate 30 is a heavily doped layer as well, during the oxidation process to form the second gate oxide layer for the poly2 layer, the poly1 layer will oxidize at a faster rate forming a thick oxide layer on top of the poly gate. The thick oxide layer acts as an effective isolation between structures formed in poly1 and poly2 layers.

In an alternate embodiment of the present invention, the poly2 layer used to form the alignment structure is a lightly doped polysilicon layer. A fabrication process may include a lightly doped polysilicon layer to provide a high sheet resistance layer for forming polysilicon resistors. When alignment structure 32 is formed using a high sheet resistance layer, the capacitive coupling effect is further minimized as the potential across the oxide layer separating the poly gate and the alignment structure is reduced, thereby improving the reliability of the LDMOS transistor thus formed.

In yet another alternate embodiment of the present invention, the alignment structure is formed using a dielectric layer, such as a silicon nitride layer. When the alignment structure is formed using a dielectric layer, the capacitive coupling effect between the poly gate and the alignment structure is eliminated. The silicon nitride layer can be a standard layer of the fabrication process or a dedicated layer added to a conventional fabrication process.

The LDMOS transistor of the present invention offers many advantages over conventional LDMOS transistor structures. First, by incorporating an alignment structure so that the drain region and drain contact opening can be formed in a self-aligned manner, the cell pitch of the LDMOS transistor can be reduced. The LDMOS transistor of the present invention can be formed in less silicon area and thus can be manufactured with reduced cost and improved yield. Also, the use of self-aligned structures eliminates process variations due to misalignment of layers. The LDMOS transistor can thus be manufactured with improved reliability and minimized variations in device electrical characteristics.

Second, when a polysilicon alignment structure is used, the limitation of minimum poly gate length due to source/body mask/lithography requirements is eliminated and the channel length of the poly gate can be shortened. In the conventional LDMOS transistor, the channel length of the poly gate is limited to a certain minimum length to provide sufficient room for accommodating the P-body mask. As discussed above, in an LDMOS transistor, the source region implant and the body implant are performed self-aligned to the source end of the poly gate. Therefore, the source/body mask (such as a photoresist layer) straddles the poly gate. The minimum channel length is defined by the minimum overlap of the source/body mask over the poly gate and the minimum poly gate length beyond the minimum overlap to provide for misalignment tolerance. However, in accordance with the present invention, the poly gate and the alignment structure form a contiguous structure on which the source/body mask can be formed. Because the entire length of the poly gate and the alignment structure (polysilicon or dielectric) can be used for the placement of the source/body implant mask, a shorter channel length for the poly gate can be realized while still providing sufficient area to meet lithography requirements of the source/body implant mask.

Lastly, a significant advantage of the LDMOS transistor of the present invention is the improvement in electrical characteristics of the transistor. By incorporating alignment structure 32 in LDMOS transistor 20 of the present invention, the drain region and drain contact opening are formed self-aligned and the channel length can be reduced. As a result, the overall cell pitch is reduced which has the effect of reducing the specific resistance of the transistor. The specific resistance of the transistor is the product of the device resistance $R_{DS}$ and the area (A) of the transistor. When the specific resistance of the transistor is reduced, conduction loss of the transistor is minimized.

Figure 3:
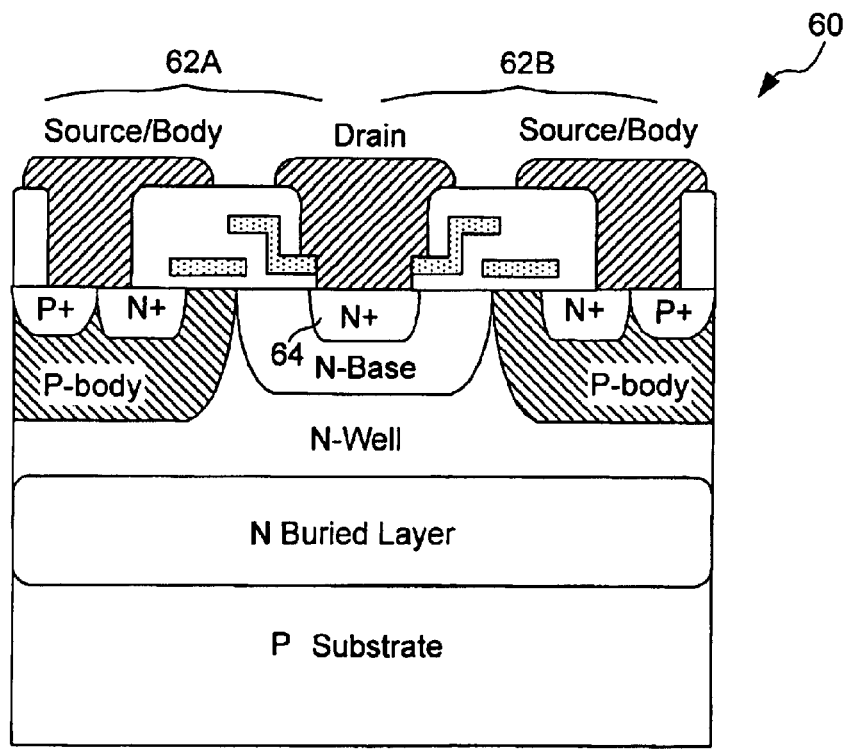
FIG. 3 is a cross-sectional view of two LDMOS transistors formed in a multi-cell array according to one embodiment of the present invention.

According to an alternate embodiment, LDMOS transistor 20 of FIG. 2 forms a unit cell structure which can be repeated to form an array of interconnected LDMOS transistors. FIG. 3 is a cross-sectional view of two LDMOS transistors formed in a multi-cell array according to one embodiment of the present invention. Referring to FIG. 3, LDMOS transistor array 60 includes a first LDMOS transistor 62A and a second LDMOS transistor 62B formed by sharing a common drain region 64. Each of transistors 62A and 62B is formed in the same manner as LDMOS transistor 20. An one or two dimensional array of LDMOS transistors can be formed by using the unit cell structure of LDMOS transistor 20 and by forming common drain regions as shown in FIG. 3. Because the cell pitch of each transistor unit cell can be made smaller than conventional LDMOS transistors, an array of LDMOS transistors of the present invention can also be made smaller.

Figure 4:
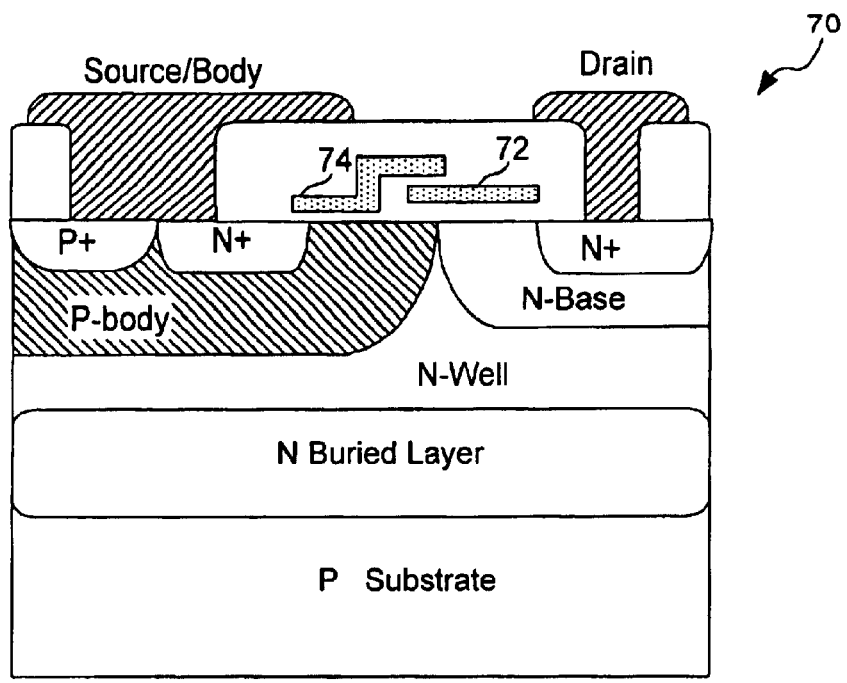
FIG. 4 is a cross-sectional view of an LDMOS transistor according to an alternate embodiment of the present invention.

FIG. 4 is a cross-sectional view of an LDMOS transistor according to an alternate embodiment of the present invention. N-type LDMOS transistor 70 can be formed using the same processing steps as LDMOS transistor 20 of FIG. 2 and detail processing steps will not be further described. In the alternate embodiment of FIG. 4, LDMOS transistor 70 is formed by using the poly1 layer as the alignment structure 72 and the poly2 layer as the poly gate 74. Thus, as shown in FIG. 4, the drain end of poly gate 74 overlaps alignment structure 72. In the present embodiment, alignment structure 72 is left floating.

Figure 5:
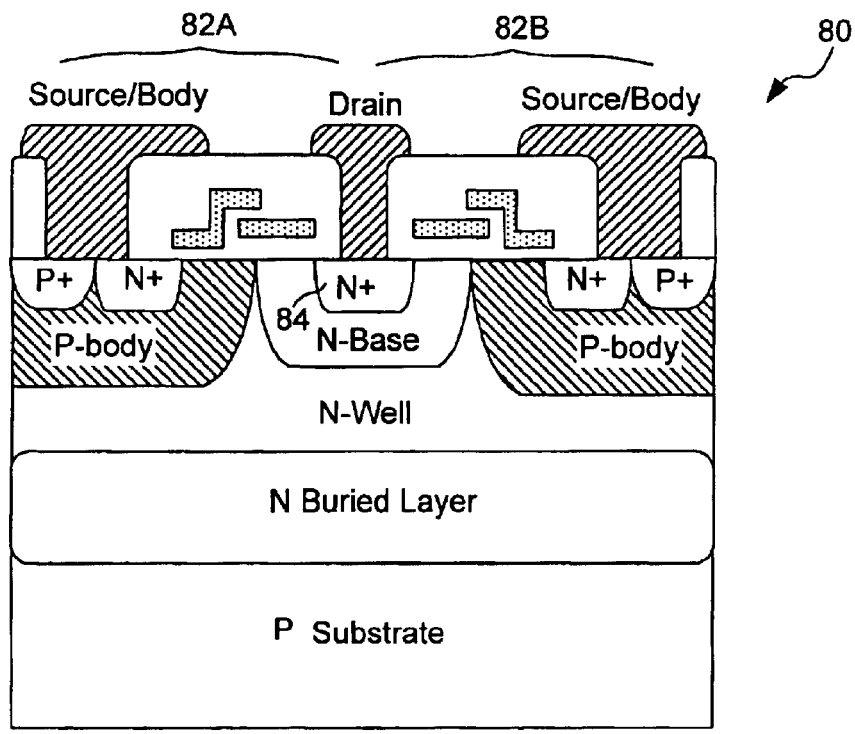
FIG. 5 is a cross-sectional view of two LDMOS transistors formed in a multi-cell array according to an alternate embodiment of the present invention.

The unit cell structure of LDMOS transistor 70 can be used to form a multi-cell array of LDMOS transistors. FIG. 5 illustrates a multi-cell array 80 of LDMOS transistors formed by LDMOS transistors 82A and 82B sharing a common drain region 84. The multi-cell array 80 of LDMOS transistors can be formed in stripes as an one dimensional array of transistors or in a cellular cell configurations as a two dimensional array of transistors. The poly1 layer used to form the alignment structure can be a high sheet resistance layer or a low sheet resistance layer. Also, the alignment structure can be formed using a dielectric layer.

Figure 6:
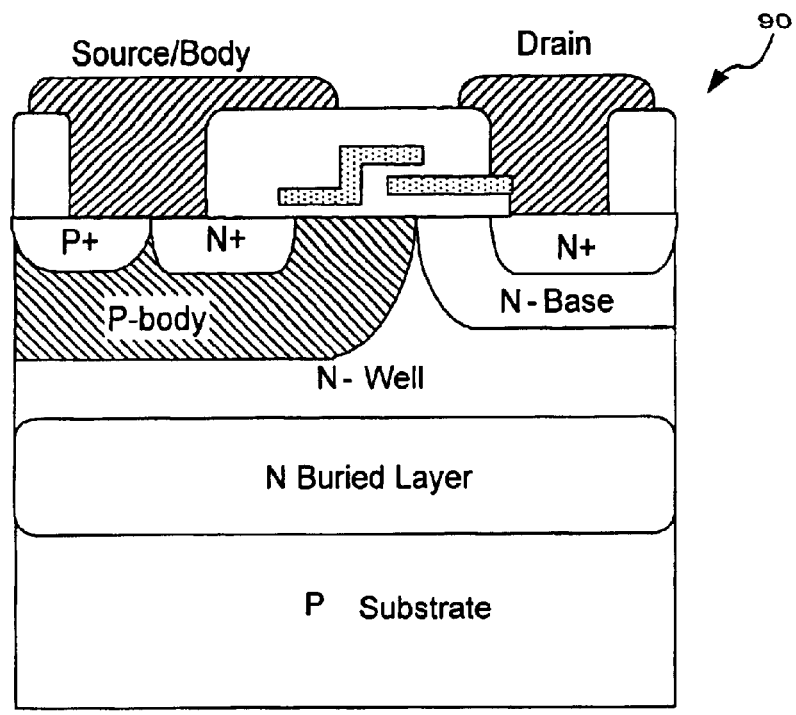
FIG. 6 is a cross-sectional view of an LDMOS transistor according to an alternate embodiment of the present invention.
Figure 7:
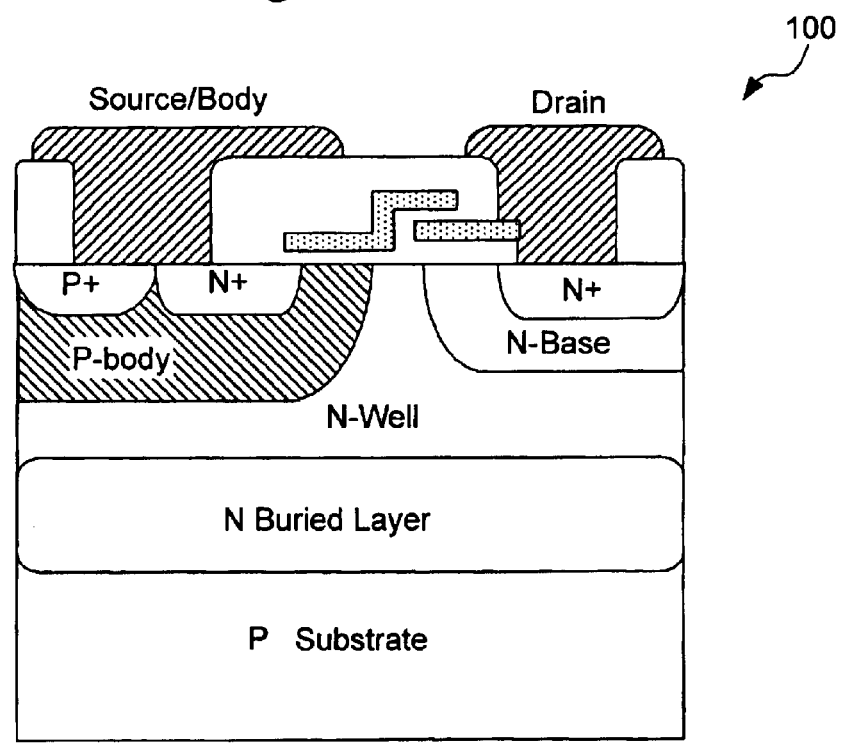
FIG. 7 is a cross-sectional view of an LDMOS transistor according to an alternate embodiment of the present invention.

Furthermore, in the embodiment shown in FIG. 4, alignment structure 72 is left floating. In an alternate embodiment, the alignment structure is formed shorted to the drain metal contact as shown in FIG. 6. Furthermore, in the embodiments shown in FIGS. 4–6, the N-Base region is formed abutting the P-body region. This configuration is illustrative only. In other embodiments, the N-Base region can be formed spaced apart from the P-body region as shown in FIG. 7. In LDMOS transistor 100 of FIG. 7, a higher drain to body breakdown voltage can be realized.

Returning to FIG. 4, in LDMOS transistor 70, alignment structure 72 is left floating, that is, not electrically shorted to the drain region. Leaving alignment structure 72 floating provides several advantages. First, the capacitance between the poly gate and the alignment structure is reduced substantially, resulting in faster gate charging at the poly gate and improved switching speed of the transistor. Second, if the drain contact is allowed to straddle the alignment structure, a limited amount of contact misalignment can be tolerated as large misalignment can result in shorting of the contact opening to poly gate 74. Therefore, when the poly1 layer is used to form the alignment structure, it is sometimes preferred that the alignment structure be left floating and the drain contact be formed spaced apart from but aligned to the alignment structure.

LDMOS transistor 70 offers other advantages over conventional LDMOS transistor structures. First, by forming the poly gate using the poly 2 layer and overlapping the poly1 alignment structure, the gate-to-drain overlap capacitance is reduced. The gate-to-drain overlap capacitance introduces Miller capacitance which results in large switching loss. By significantly reducing the gate-to-drain overlap capacitance, LDMOS transistor 70 can be operated with reduced switching loss. Second, in LDMOS transistor 70, the channel under poly gate 74 includes a thin oxide portion and a thick oxide portion where the poly gate overlaps the alignment structure. The threshold voltage of LDMOS transistor 70 is not altered appreciably by the inclusion of a thick oxide portion because of the concentration gradient of the P-body region. Specifically, because the P-body region is implanted using poly gate 74 as a mask, the subsequent diffusion of the implanted dopants results in a concentration gradient whereby the P-body doping concentration decreases from the N+ source edge towards the P-body edge. Therefore, the P-body doping concentration is higher at the thin oxide portion of the channel and lower at the thick oxide portion of the channel. In operation, poly gate 74 can invert the channel because the higher doping concentration is under the thin oxide portion and the lower doping concentration is under the thick oxide portion. Of course, in other embodiments, LDMOS transistor 70 can be formed where the thin oxide portion of the channel extends throughout the P-body region.

Figure 8:
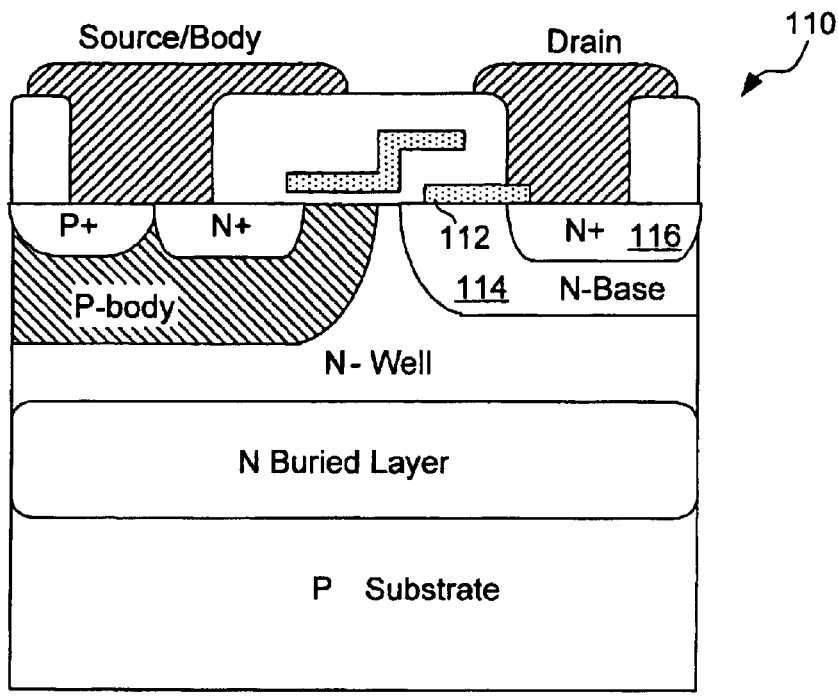
FIG. 8 is a cross-sectional view of an LDMOS transistor according to an alternate embodiment of the present invention.
Figure 9:
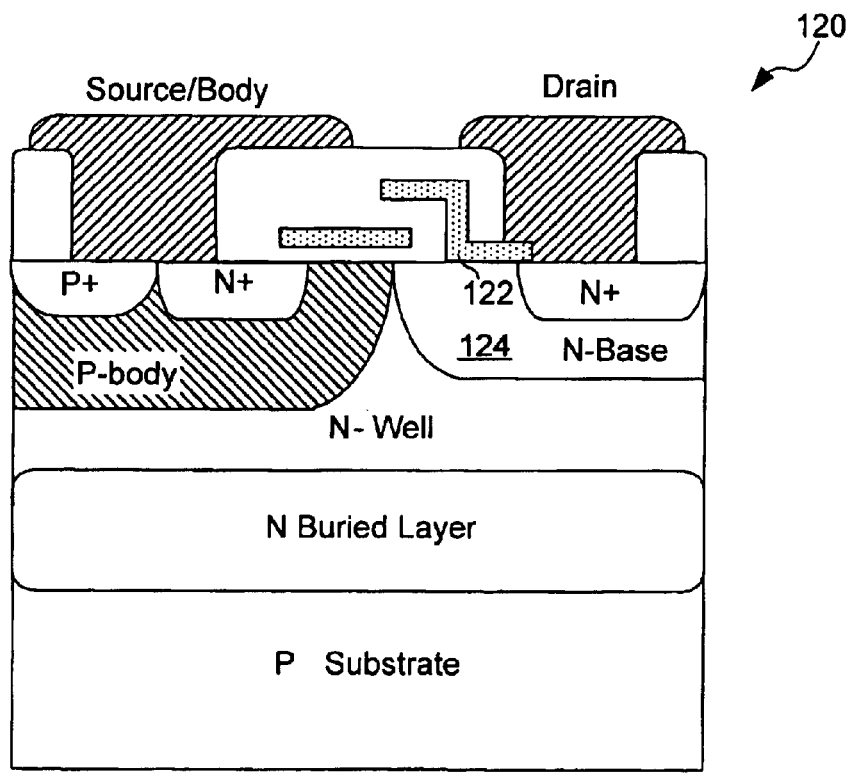
FIG. 9 is a cross-sectional view of an LDMOS transistor according to an alternate embodiment of the present invention.

FIGS. 8 and 9 are cross-sectional views of LDMOS transistors according to alternate embodiments of the present invention. In the embodiments shown in FIGS. 8 and 9, the alignment structures are formed directly on the surface of the semiconductor layer and also serve the functions of doping the semiconductor substrate to form the N-Base regions. This process is akin to the poly emitter process used in forming bipolar transistors where a heavily doped polysilicon layer is used to dope the silicon to form a diffusion region underneath the heavily doped emitter poly layer.

In LDMOS transistor 110 of FIG. 8, alignment structure 112 is formed in the poly1 layer and is formed directly on the semiconductor layer. Alignment structure 112 is a heavily doped polysilicon layer. By placing alignment structure 112 directly on the surface of the semiconductor layer, the dopants incorporated in the alignment structure can diffuse into the semiconductor layer during subsequently anneal process. In this manner, LDMOS transistor 110 is formed as a fully self-aligned transistor where N+ drain region 116 is self-aligned to the right edge (drain end) of alignment structure 112 and N-Base 114 is formed by doping from alignment structure 112 itself.

LDMOS transistor 120 of FIG. 9 is an alternate embodiment of LDMOS transistor 110 of FIG. 8 where the poly2 layer is used to form an alignment structure 122. A portion of alignment structure 122 is formed on the surface of the semiconductor structure which is used to dope the semiconductor layer to from N-Base region 124. The remaining portion of the alignment structure overlaps the poly gate formed in the poly1 layer.

In the embodiments shown in FIGS. 8 and 9, the drain metal contacts straddle the alignment structures. In other embodiments, the alignment structures can be left floating without being shorted to the drain metal contacts.

Figure 10:
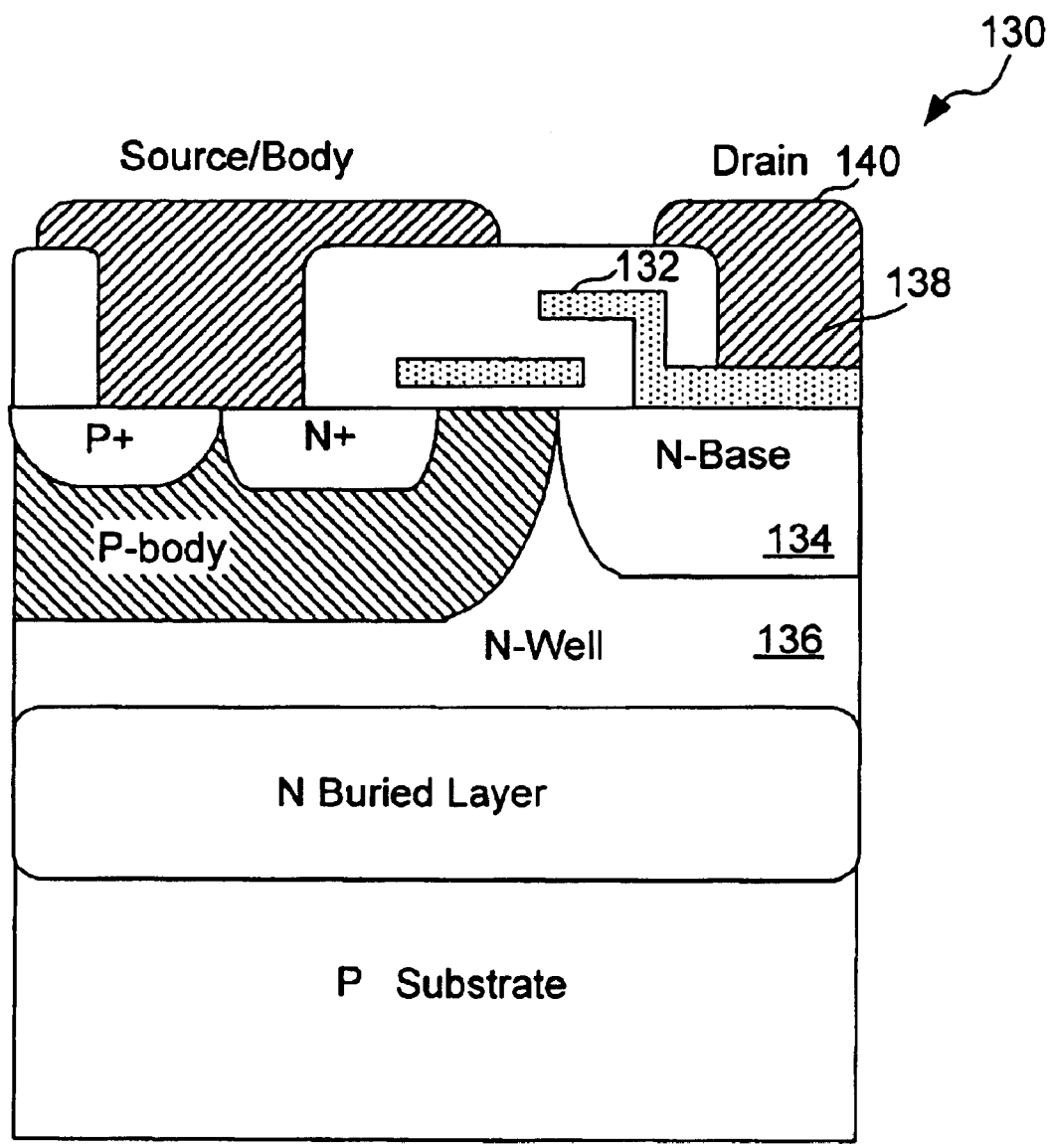
FIG. 10 is a cross-sectional view of an LDMOS transistor according to an alternate embodiment of the present invention.

FIG. 10 is a cross-sectional view of an LDMOS transistor according to yet another embodiment of the present invention. In LDMOS transistor 130 of FIG. 10, an alignment structure 132 is formed using a heavily doped poly2 layer and is formed on the top surface of the semiconductor layer. Furthermore, alignment structure 132 is extended to serve as a drain contact for LDMOS transistor 130. Specifically, the portion of the heavily doped polysilicon alignment structure that contacts the top surface of the semiconductor layer is used to dope the semiconductor layer to form N-Base region 134 in N-Well 136. A drain contact opening 138 is formed on polysilicon alignment structure 132 and drain metal contact 140 is formed in contact opening 138 for making electrical connection to N-Base 134 through alignment structure 132. In this embodiment, an N+ drain region in the semiconductor layer is eliminated and alignment structure 132 provides a low resistance connection between the drain metal contact and the N-base region in the semiconductor layer. In another embodiment, alignment structure 132 can be formed using the poly1 layer.

The above detailed descriptions are provided to illustrate specific embodiments of the present invention and are not intended to be limiting. Numerous modifications and variations within the scope of the present invention are possible. For example, in the above described embodiments, the P-body region is formed self-aligned to the source end of the polysilicon gate. In other embodiments, the p-body region can be formed using a diffusion region that is not self-aligned to the source-end of the polysilicon gate. For instance, the p-body region can be formed using a P-Well diffusion region.

Additionally, while the above embodiments illustrate N-type LDMOS transistors, one of ordinary skill in the art would appreciate that the incorporation of the alignment structure of the present invention can be readily applied to P-type LDMOS transistors. Furthermore, the alignment structure of the present invention can be incorporated in enhancement mode or depletion mode LDMOS transistors. The present invention is defined by the appended claims.

I claim:

1. An LDMOS transistor, comprising:
   a body region of a first conductivity type formed in a semiconductor layer of a second conductivity type;
   a source region of the second conductivity type formed in the body region;
   a conductive gate insulated from the semiconductor layer by a first dielectric layer and overlying the body region, the source region being formed self-aligned to a first edge of the conductive gate;
   an alignment structure formed adjacent a second edge, opposite the first edge, of the conductive gate, the alignment structure having a first edge in proximity to the second edge of the conductive gate and a second edge opposite the first edge; and
   a drain region of the second conductivity type formed in the semiconductor layer self-aligned to the second edge of the alignment structure.

2. The LDMOS transistor of claim 1, wherein the conductive gate comprises a first polysilicon layer and the alignment structure comprises a second polysilicon layer, the second polysilicon layer being formed after the first polysilicon layer and being insulated from the first polysilicon layer by a second dielectric layer.

3. The LDMOS transistor of claim 2, wherein the first edge of the alignment structure overlaps the second edge of the conductive gate.

4. The LDMOS transistor of claim 2, wherein the second polysilicon layer comprises a heavily doped polysilicon layer.

5. The LDMOS transistor of claim 2, wherein the second polysilicon layer comprises a lightly doped polysilicon layer.

6. The LDMOS transistor of claim 1, wherein the alignment structure comprises a first polysilicon layer and the conductive gate comprises a second polysilicon layer, the second polysilicon layer being formed after the first polysilicon layer and being insulated from the first polysilicon layer by a second dielectric layer.

7. The LDMOS transistor of claim 6, wherein the second edge of the conductive gate overlaps the first edge of the alignment structure.

8. The LDMOS transistor of claim 6, wherein the first polysilicon layer comprises a heavily doped polysilicon layer.

9. The LDMOS transistor of claim 6, wherein the first polysilicon layer comprises a lightly doped polysilicon layer.

10. The LDMOS transistor of claim 1, wherein the conductive gate comprises a polysilicon layer and the alignment structure comprises a second dielectric layer.

11. The LDMOS transistor of claim 10, wherein the second dielectric layer comprises a silicon nitride layer.

12. The LDMOS transistor of claim 1, wherein the alignment structure is electrically shorted to the drain region.

13. The LDMOS transistor of claim 12, further comprising:
a drain contact opening formed above the drain region, the drain contact opening partially overlying the second edge of the alignment structure; and
a drain metallization formed in the drain contact opening, the drain metallization electrically connected to the alignment structure and to the drain region.

14. The LDMOS transistor of claim 1, further comprising:
a drain contact opening formed above the drain region; and
a drain metallization formed in the drain contact opening;
wherein the alignment structure is electrically isolated from the drain metallization and the drain region.

15. The LDMOS transistor of claim 1, further comprising:
a first region of the second conductivity type formed in the semiconductor layer and being more heavily doped than the semiconductor layer, wherein the drain region is formed in the first region and the first region has a first edge proximate to an edge of the body region.

16. The LDMOS transistor of claim 15, wherein the first region abuts the body region.

17. The LDMOS transistor of claim 1, wherein the alignment structure is insulated from the semiconductor layer by a second dielectric layer.

18. The LDMOS transistor of claim 17, wherein a thickness of the first dielectric layer is different than a thickness of the second dielectric layer.

19. The LDMOS transistor of claim 1, wherein the alignment structure is formed on a top surface of the semiconductor layer.

20. The LDMOS transistor of claim 19, wherein the alignment structure comprises a heavily doped polysilicon layer.

21. The LDMOS transistor of claim 1, wherein the first conductivity type is P-type and the second conductivity type is N-type.

22. The LDMOS transistor of claim 1, wherein the first conductivity type is N-type and the second conductivity type is P-type.

23. The LDMOS transistor of claim 1, wherein the semiconductor layer comprises a well region of the second conductivity type formed in an epitaxial layer.

24. The LDMOS transistor of claim 1, wherein the body region is formed self-aligned to the first edge of the conductive gate.

25. The LDMOS transistor of claim 1, wherein the body region comprises a well region of the first conductivity type and is formed not self-aligned to the first edge of the conductive gate.

26. An LDMOS transistor, comprising:
a body region of a first conductivity type formed in a semiconductor layer of a second conductivity type;
a source region of the second conductivity type formed in the body region;
a conductive gate insulated from the semiconductor layer by a first dielectric layer and overlying the body region, the source region being formed self-aligned to a first edge of the conductive gate;
an alignment structure formed adjacent a second edge, opposite the first edge, of the conductive gate, the alignment structure having a first edge in proximity to the second edge of the conductive gate and a second edge opposite the first edge; and
a drain region of the second conductivity type formed in the semiconductor layer underneath the alignment structure.

27. The LDMOS transistor of claim 26, wherein the alignment structure comprises a heavily doped polysilicon layer and is formed on the surface of the semiconductor layer.

28. The LDMOS transistor of claim 27, wherein the drain region is formed by doping of the semiconductor layer by the alignment structure.

29. The LDMOS transistor of claim 27, further comprising:
a drain contact opening formed above the alignment structure, the drain contact opening being positioned above the drain region; and
a drain metallization formed in the drain contact opening, the drain metallization electrically connected to the alignment structure.

30. The LDMOS transistor of claim 27, wherein the conductive gate comprises a first polysilicon layer and the alignment structure comprises a second polysilicon layer, the second polysilicon layer being formed after the first polysilicon layer and being insulated from the first polysilicon layer by a second dielectric layer.

31. The LDMOS transistor of claim 27, wherein the alignment structure comprises a first polysilicon layer and the conductive gate comprises a second polysilicon layer, the second polysilicon layer being formed after the first polysilicon layer and being insulated from the first polysilicon layer by a second dielectric layer.

32. The LDMOS transistor of claim 26, wherein the drain region abuts the body region.

33. The LDMOS transistor of claim 26, wherein the first conductivity type is P-type and the second conductivity type is N-type.

34. The LDMOS transistor of claim 26, wherein the first conductivity type is N-type and the second conductivity type is P-type.

35. The LDMOS transistor of claim 26, wherein the semiconductor layer comprises a well region of the second conductivity type formed in an epitaxial layer.

36. An array of LDMOS transistors, comprising:
a first LDMOS transistor comprising:
a body region of a first conductivity type formed in a semiconductor layer of a second conductivity type;
a source region of the second conductivity type formed in the body region;
a conductive gate insulated from the semiconductor layer by a first dielectric layer and overlying the body region, the source region being formed self-aligned to a first edge of the conductive gate;

an alignment structure formed adjacent a second edge, opposite the first edge, of the conductive gate, the alignment structure having a first edge in proximity to the second edge of the conductive gate and a second edge opposite the first edge; and a drain region of the second conductivity type formed in the semiconductor layer self-aligned to the second edge of the alignment structure; and a second LDMOS transistor comprising:

a body region of a first conductivity type formed in a semiconductor layer of a second conductivity type;

a source region of the second conductivity type formed in the body region;

a conductive gate insulated from the semiconductor layer by a first dielectric layer and overlying the body region, the source region being formed self-aligned to a first edge of the conductive gate;

an alignment structure formed adjacent a second edge, opposite the first edge, of the conductive gate, the alignment structure having a first edge in proximity to the second edge of the conductive gate and a second edge opposite the first edge; and a drain region of the second conductivity type formed in the semiconductor layer self-aligned to the second edge of the alignment structure;

wherein the drain region of the first LDMOS transistor and the drain region of the second LDMOS transistor comprise a common the drain region.

* * * * *